United States Patent [19]
Sasaki et al.

[11] Patent Number: 5,476,064
[45] Date of Patent: Dec. 19, 1995

[54] PULL METHOD FOR GROWTH OF SINGLE CRYSTAL USING DENSITY DETECTOR AND APPARATUS THEREFOR

[75] Inventors: Hitoshi Sasaki, #A-101, Kawamurahaitsu, 2-42-2, Kasuga, Tsukuba-shi, Ibaragi-ken, 305; Eiji Tokizaki, Ibaragi; Kazutaka Terashima, 206-3, Nakano, Ebina-shi, Kawagawa-ken, 243-04; Akira Nagashima, Tokyo; Shigeyuki Kimura, Ibaragi, all of Japan

[73] Assignees: Research Development Corporation of Japan, Tokyo; Hitoshi Sasaki, Ibaragi; Kazutaka Terashima, Kanagawa, all of Japan

[21] Appl. No.: 214,496

[22] Filed: Mar. 18, 1994

[30] Foreign Application Priority Data

Mar. 29, 1993 [JP] Japan .................................. 5-069925
Jul. 12, 1993 [JP] Japan .................................. 5-171314

[51] Int. Cl.[6] .................................................. C30B 15/20
[52] U.S. Cl. ............................ 117/15; 117/14; 117/201; 117/202; 117/208
[58] Field of Search .................... 117/14, 15, 201, 117/202, 208

[56] References Cited

U.S. PATENT DOCUMENTS

| | | | |
|---|---|---|---|
| 4,167,554 | 9/1979 | Fisher | 117/15 |
| 4,256,681 | 3/1981 | Lindmayer | 264/85 |
| 4,258,003 | 3/1981 | Hurle et al. | 422/109 |
| 4,508,970 | 4/1985 | Ackerman | 250/577 |
| 4,660,149 | 4/1987 | Lissalde et al. | 117/15 |

*Primary Examiner*—Robert Kunemund
*Attorney, Agent, or Firm*—Beveridge, DeGrandi, Weilacher & Young

[57] ABSTRACT

The density of a melt precisely represents the stability of the melt, so that the initiation of pulling-up operation can be determined on the basis of the changing rate of the density. The pulling-up operation may be started when the density becomes constant, or when the changing rate of the density with respect to the temperature becomes smaller. Since the melt or clusters do not include different minute structures, an obtained single crystal is of high quality free from minute faults or dislocations.

5 Claims, 5 Drawing Sheets

DENSITY OF Si MELT

DENSITY OF Ge MELT

CHANGE OF DENSITY OF Si MELT

CHANGE OF DENSITY OF Ge MELT

PULL METHOD FOR GROWTH OF SINGLE CRYSTAL USING DENSITY DETECTOR AND APPARATUS THEREFOR

BACKGROUND OF THE INVENTION

The present invention relates to a pull method of producing a single crystal from such a melt as metal, semiconductive material or oxide under a stabilized condition inhibiting the formation of minute faults or dislocations, and also relates to an apparatus useful for said pull method.

Czochralski method is a representative method for the growth of a single crystal from a melt.

Czochralski method uses a crucible 2 provided in a closed chamber 1 as shown in FIG. 1. The crucible 2 is supported by a supportor 3 so that the crucible 2 is capable of rotation and/or vertical motion. There are concentrically disposed a heater 4 and a heat insulator 5 around the crucible 2. A raw material is received in the crucible 2 and intensively heated by the heater 4 to prepare a melt 6. The melt 6 is held at a temperature suitable for the growth of a single crystal. When a seed crystal 7 being hung from a rotary winder 10 through a wire 9 is brought into contact with the melt 6, a single crystal 8 grows on the seed crystal 7 so that the crystalline orientation of the seed crystal 7 is transferred to that of the growing crystal 8. The seed crystal 7 is then rotatingly pulled up in response to the growth of the single crystal 8. The crucible 2 is descendingly rotated by the rotating motion of the support 3, too. The obtained single crystal 8 is sheared to wafers to be used as substrates for semiconductor devices.

By the way, semiconductor substrates of higher quality are demanded, as semiconductor devices are integrated with higher density. In order to obtain a semiconductor substrate of high quality, it is necessary to inhibit dislocations or cystalline faults which would be included in the single crystal. On the other hand, the production :of substrates for semiconductor devices with high productivity requires the improvement which enables the growth of a single crystal larger in diameter.

According to Czochlarski method, a single crystal is pulled up from a melt held at a high temperature, so that the quality of the obtained single crystal is significantly affected by the conditions of the melt near the interface of crystal growth.

There are clusters, i.e. agglomerates different in minute structures, in the melt which changes physical properties to larger extents. The minute structures are varied in response to the thermal hysteresis of the melt. In case where a melt just after prepared by melting a polycrystalline raw material is held at a temperature slightly higher than its melting point, there remain a lot of clusters having covalent bonds which have transferred the crystalline structure of the raw material. In addition, there are irregular structures in the interface of crystal growth. When a single crystal is let grow from such a heterogeneous melt, the regular rearrangement of molten atoms on a seed crystal is impeded by the covalent bond of the clusters. Minute faults and dislocations originated in the irregular structure of the melt are likely to be included in the single crystal pulled up from such the melt. Consequently, single crystals of stabilized quality can not be produced at a high yield.

In principle, the melt can be conditioned to a homogeneous state suitable for the growth of a single crystal free from minute faults and dislocations, by heating the melt at a temperature above the critical point at which irregular structures in the melt disappear, or by controlling the temperature of the melt with high accuracy. However, the melt is inevitably heated at a temperature, e.g. 1440°–1460° C., sufficiently higher than the critical point for a long time, e.g. 3–4 hrs., since there have been known neither an accurate critical point nor the influence of temperature fluctuation on the minute structures of the melt. The heating time is experimentally determined taking into consideration various factors such as the material of the melt, the capacity of the crucible and the power of a heater.

The excessive heating requires a long time before the initiation of operations for pulling up the single crystal in addition to the consumption of a large quantity of thermal energy. As a result, the single crystals are not produced with high productivity at a low cost.

These disadvantages can be overcome, if it is possible to make short the period from the melting of the raw material to the initiation of pulling up the single crystal. In this regard, it is necessary to accurately detect the physical properties of the melt and the fluctuation of the physical properties in a short time. The obtained data will be effective for judging whether the melt is stable or unstable. We have proposed a new density detector as disclosed Japanese Patent Application 4-317900. The density of a melt can be accurately detected without errors derived from buoyancy, by using the density detector. During the investigation of various melts using the proposed density detector, we have found the phenomena that the melt prepared by melting a polycrystalline raw material has the tendency to lower its density as the rising of the temperature and that there is the reflection point where the changing rate of the density with respect to the temperature of the melt apparently differs from each other during the temperature falling of the melt.

SUMMARY OF THE INVENTION

An object of the present invention is to start operations for pulling up a single crystal in a short time after the preparation of the melt.

Another object of the present invention is to utilize the data on the density of a melt for judging the condition of the melt, said data being obtained by using such a density detector as one which we have proposed before.

Still another object of the present invention is to produce a single crystal of high quality with high productivity without the inclusion of minute faults or dislocations originated in clusters having different minute structures.

According to the present invention, a density detector is dipped in a melt, and the density fluctuation of the melt is detected from the change in the weight of the detector. The operation for pulling up a single crystal from the melt may be started when the density fluctuation becomes smaller. The density of the melt and its changing rate with respect to the temperature or the holding time of the melt is detected with high accuracy by using the detector. The obtained data on the density is valuable for determining the time to start the operation for pulling up a single crystal.

We have investigated the detected density in the relationship with the temperature of the melt, and found the turning point $t_1$ where the gradient of the density with respect to the temperature of the melt changes from a larger one to a smaller one. The turning point $t_1$ is approximately 1440° C. as for Si melt. The turning point $t_1$ is valuable for determining the time to start the operation for pulling up a single crystal from the melt.

DETAILED DESCRIPTION OF THE PREFERRED EMBODIMENTS

When Si melt is prepared by melting a polycrystalline raw material, the melt at the initial stage of melting includes irregular minute structures originated in the crystallographic anisotropy of the raw material and the disorder of crystalline interface. In a conventional method, the melt is held in a molten state for a certain time enough to make the melt homegeneous. However, the melt holding inevitably takes a fairly long time, since the liquid-phase minute structures are not made quantitatively clear. Consequently, it necessarily takes a long time to start operations for pulling up a single crystal.

Figure 1:
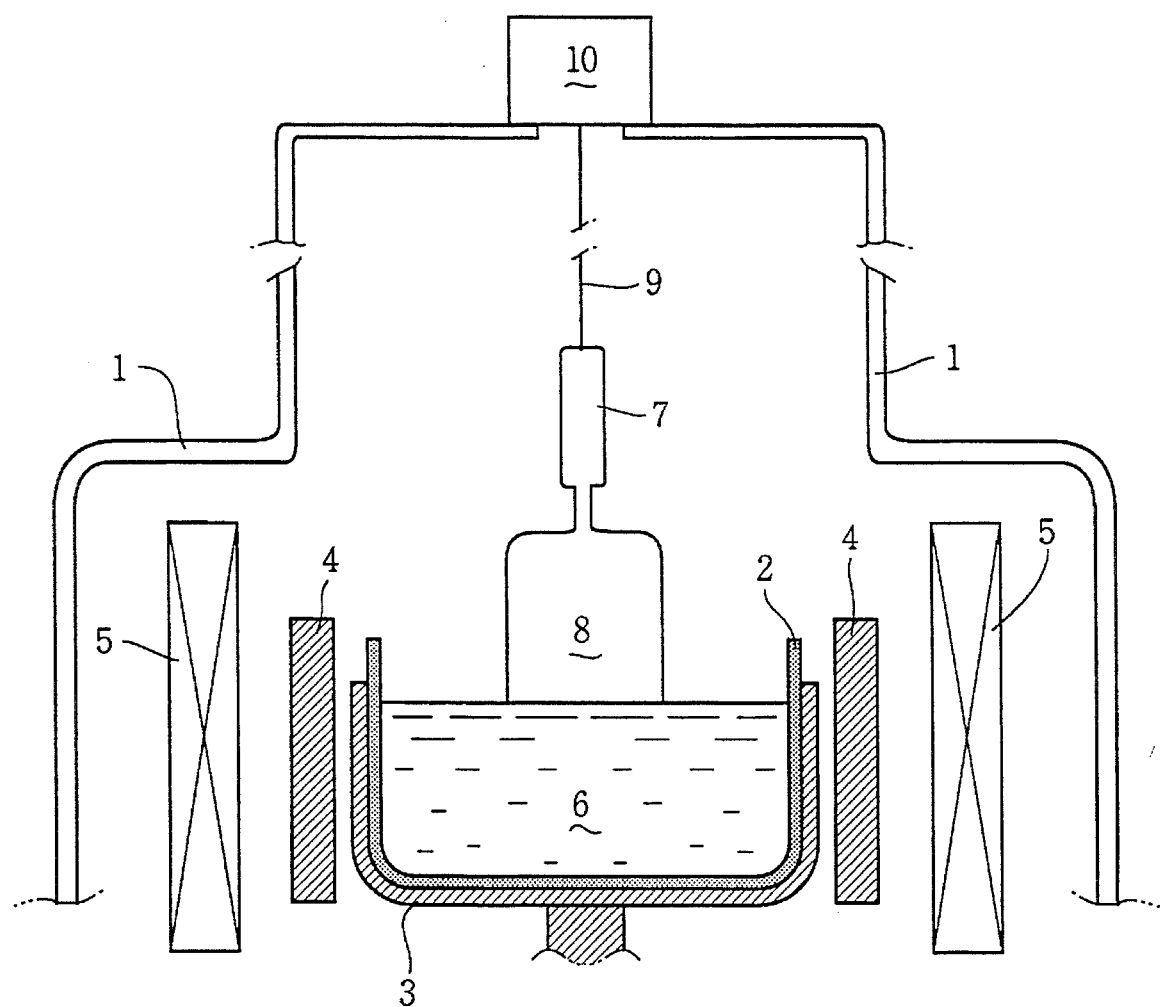
FIG. 1 is a schematic view illustrating an apparatus for pulling up a single crystal from a melt according to Czochlarski method.
Figure 2:
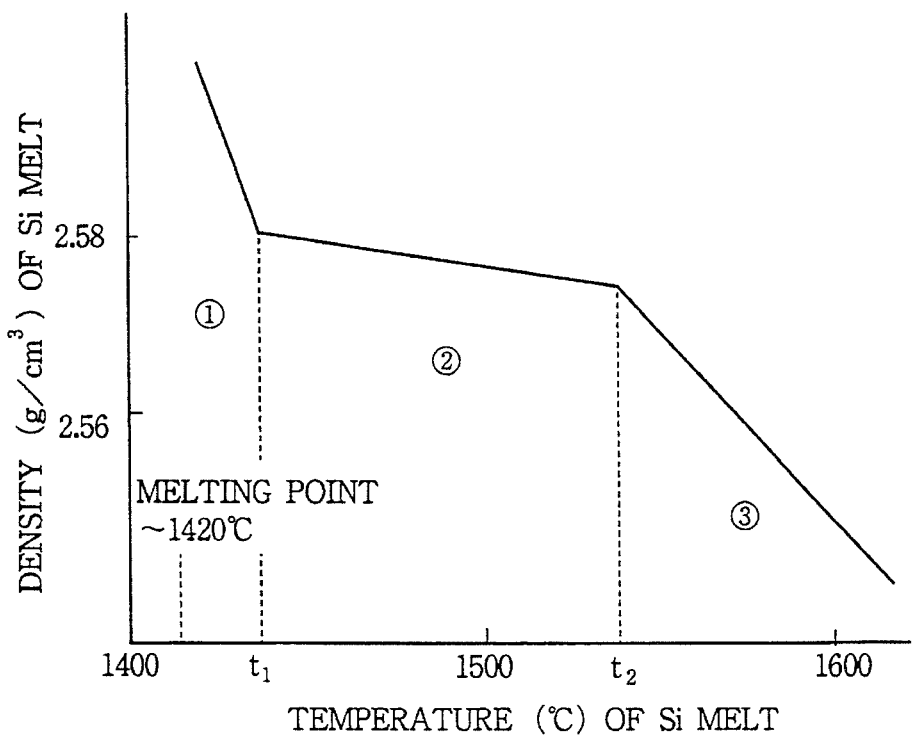
FIG. 2 is a diagram illustrating the relationship between the density of Si melt and its temperature.

We have researched the state of the melt from various aspects. In the course of researches and experiments, we have found that there is the close relationship between the density of a melt and liquid-phase minute structures. The liquid-phase minute structures are converted to clusters suspended near the interface of crystal growth and then introduced into a single crystal being pulled up. Violent fluctuations in the density of the melt represents the state that the melt is abruptly changing its minute structures to a broad extent. When a single crystal is let grow from such a melt, the crystallographic disorder which would cause minute faults or dislocations is introduced into the single crystal. On the other hand, when the density of the melt does not fluctuate, the minute structures are presumed stable so as to enable the growth of a single crystal excellent in crystallographic regularity. Fig.2 shows the relationship between the temperature and the density of a Si melt prepared from a polycrystalline raw material. When a polycrystalline raw material is melted and heated up to a temperature $t_1$ ($\approx 1440°$ C.) in zone ①, the density of a melt rapidly becomes lower with respect to a temperature.

When the Si melt is heated up to a temperature $t_2$ ($\approx 1530°$ C.), the density of the melt becomes continuously smaller with respect to the rising of the temperature (zone ②). The reducing rate of the density becomes a little bit larger in the zone ③ exceeding the temperature $t_2$.

The difference in the changing rates of the density suggests the formation of clusters having minute structures different from each other in zones ① to ③. Otherwise, the clusters, which have minute structures different from those of clusters formed in the zones ① and ③, would be formed in the zone ② in coexistence with the clusters formed in the zones ① and ③. Thermal energy is being violently exchanged between the high- or low-temperature parts and the surroundings,: resulting in the violent change of the liquid-phase minute structures.

If this presumption is true, different clusters would be induced to a Si single crystal being pulled up from a Si melt having a temperature distribution over the ranges ① to ③. A convection formed in a melt having a surface layer at a temperature in the zone ① suitable for the pulling-up of a single crystal and a lower layer at a temperature in the zone ② raises clusters having different minute structures near the surface of the melt and carries said clusters into the single crystal being pulled up. In this regard, several conventional pull methods emphasize temperature control on the surface layer of the melt, but there are few reports which teach the necessity of temperature control to hold a Si melt including a lower layer below a predetermined temperature.

Figure 3:
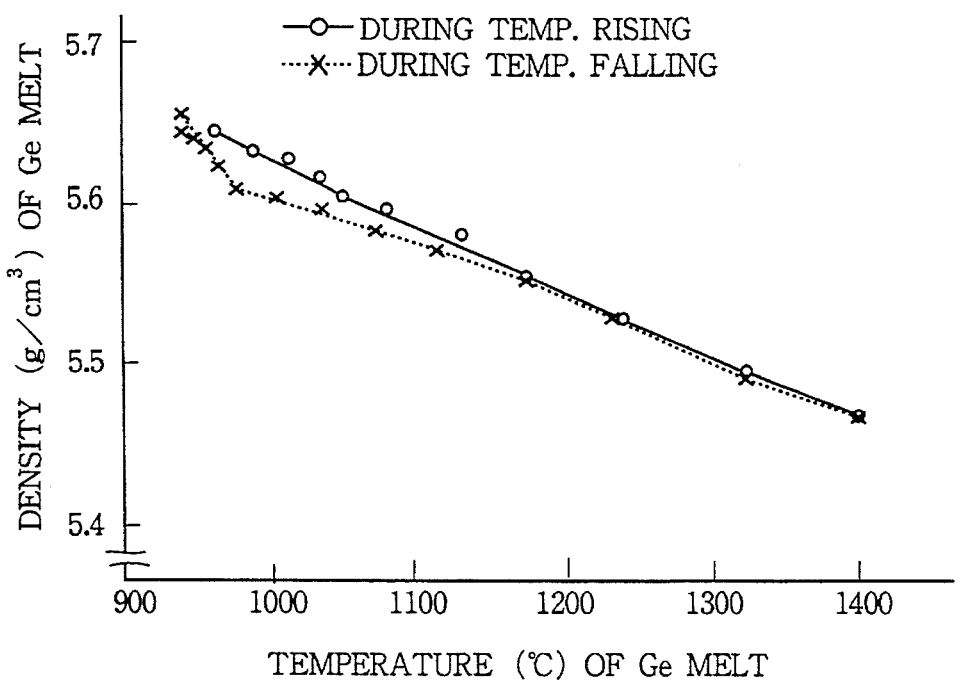
FIG. 3 is a diagram illustrating the relationship between the density of Ge melt and its temperature.

The density of Ge melt becomes continuously smaller in response to the rising of the temperature, as shown in FIG. 3. The temperature-density curve during heating the Ge melt is a little bit different from that during cooling.

When the melt is held at a high temperature for a long time after being prepared, the density of the melt comes to a certain value corresponding to the holding temperature.

Figure 4:
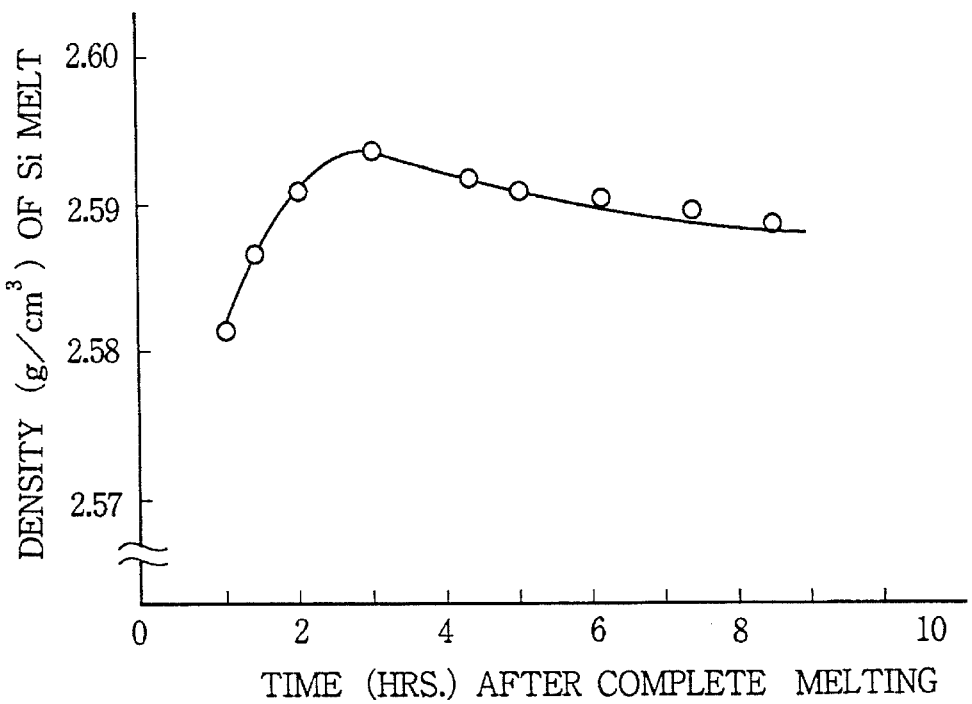
FIG. 4 is a diagram illustrating the chronological change in the density of Si melt after being completely melted.

For instance, when Si melt is held at 1430° C., its density changes during the holding time, as shown in FIG. 4. The density of the melt rapidly increases approximately 3 hrs. after the melting of Si raw material begins. Thereafter, the density gradually decreases with gentle gradient near 2.585 g/cm$^3$.

Figure 5:
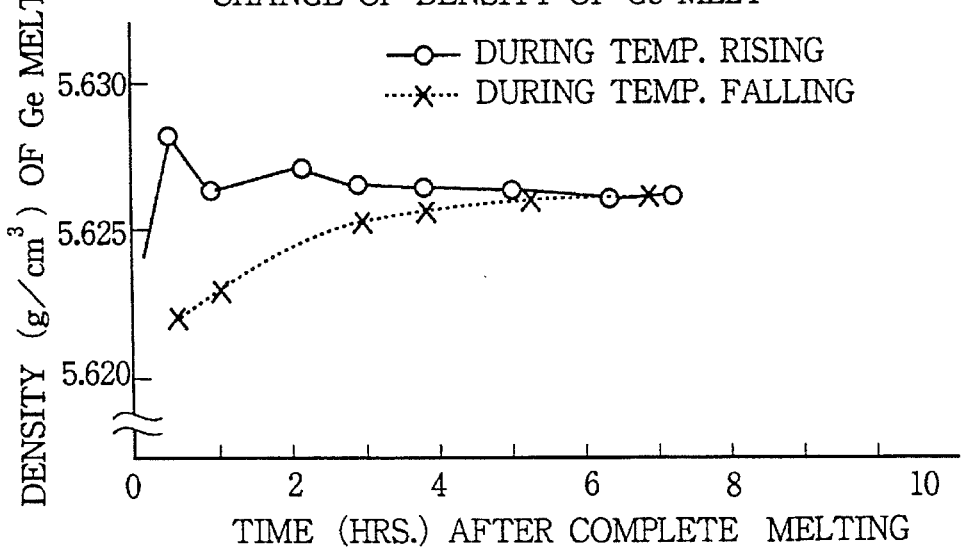
FIG. 5 is a diagram illustrating the chronological change in the density of Ge melt after being completely melted.

When Ge melt is held at 990° C., the density of the melt comes near 5.625 g/cm$^3$ during holding for a long time, as shown in FIG. 5. In this case, the time-density curve is different between a temperature rising period and a temperature falling period.

Presuming that the change of the density accurately represented the state of the melt, the temperatures $t_1$, $t_2$ (shown in FIG. 2) were predetected as for each Si melt for pulling up a single crystal therefrom, and the whole of the melt was held in the zone ① below the temperature $t_1$. When a single crystal was pulled up from said melt, minute faults and dislocations derived from the inclusion of clusters laving different liquid-phase minute structures were controlled at a low level.

The chronological change in the density of the melt may be used to determine the the starting time for pulling up a single crystal. Said chronological change is calculated from the change of the buoyancy which affects on a detector dipped in a melt.

Figure 6:
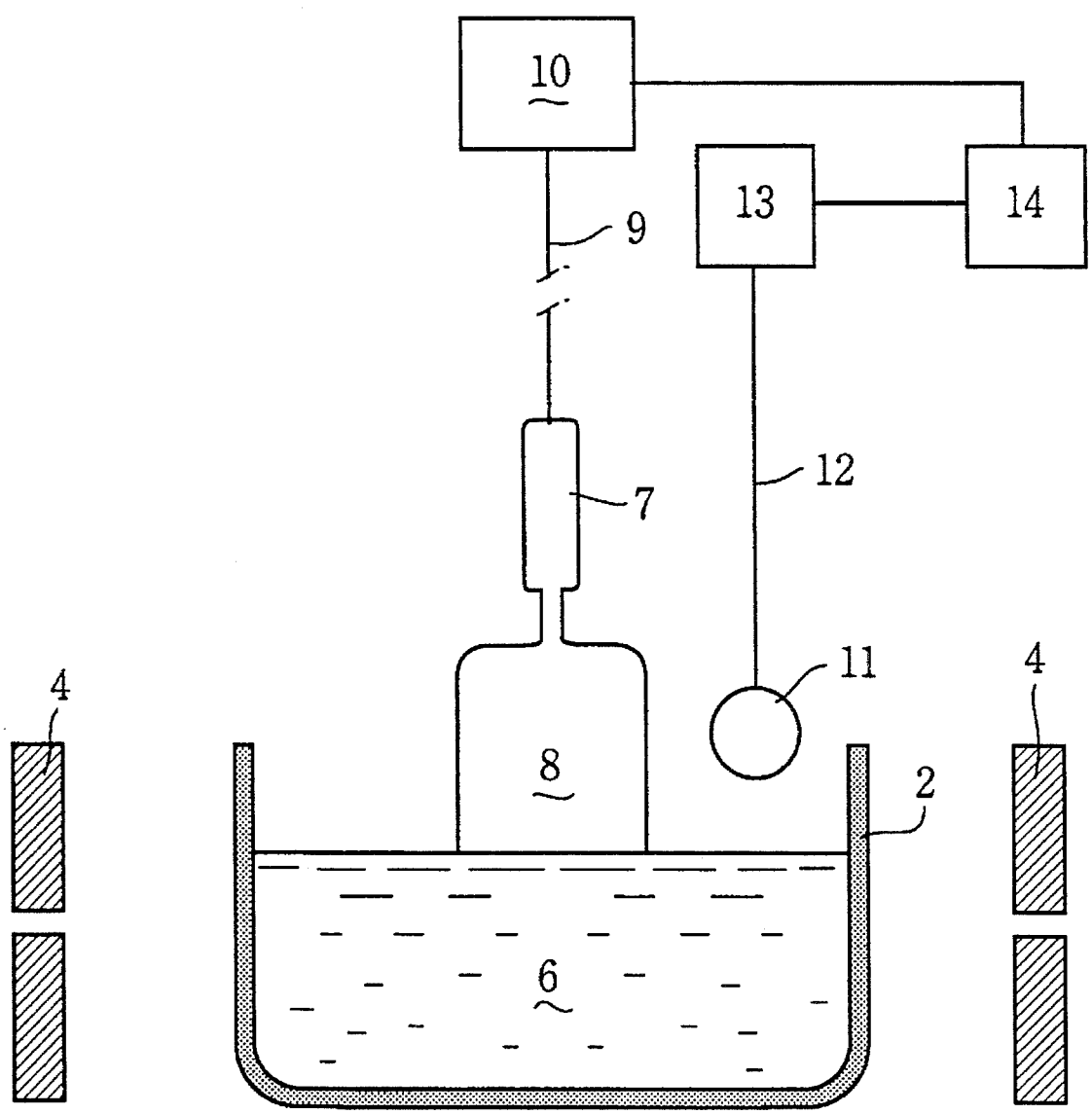
FIG. 6 is a schematic view illustrating an apparatus for pulling up a single crystal from a melt according to the present invention.

A representative method for measuring density is Archimedes' method whereby the density of a melt is calculated from the difference between the weights of a bob before being dipped in the melt and after being dipped in the melt. The density of the melt shall be detected with high accuracy to determine the reflection points $t_1$, $t_2$ at which the descending rates of the density with respect to the temperature will change. In this regard, the density detector which we have proposed in Japanese Patent Application No. 4-317900 is suitable for the purpose. The detector can precisely detect the density of the melt without any influence of surface tension. In actual, there are apparently noticed the inflection points in the temperature-density curve shown in FIG. 2 by using our proposed detector. Archimedes' method uses an apparatus as shown in FIG. 6. A detector comprises a bob 11 hung from a balance 13 by a wire 12. The detector is dipped in a melt 6 whose density is to be detected. The dipped detector is weighed by the balance 13.

The density ρ of the melt 6 is calculated according to the formula of:

$$\rho = (M_v - M_1)/V_b$$

wherein $V_b$ represents the volume of the detector to be dipped in the melt 6, $M_v$ represents the weight of the detector gauged in vacuo, and $M_1$ represents the weight of the detector dipped in the melt 6.

The volume $V_b$ of the detector is preknown by weighing the detector dipped in the liquid:, e.g. water, whose density is already known. Hereby, the density ρ is calculated from the difference between the weight $M_v$ of the detector in vacuo and the weight $M_1$ of the detector dipped in the melt 6.

A signal representing the density ρ of the melt 6 is sent to a control unit 14. The state of the melt 6 is presumed on the basis of the input signal by the control unit 14, and a control signal representing the conditions for pulling a single crystal in correspondence with the result of the presumption is outputted to a rotary winder 10. In practice, when the density ρ and its deviation are held within proper ranges, a signal for the initiation of pulling operation is outputted to a rotary winder 10 to carry downwards a seed crystal 7 into contact with the surface of the melt 6. Thereafter, the seed crystal 7 is gradually lifted to pull a single crystal 8 from the melt 6.

FIG. 6 illustrates a single detector comprising the bob 11 and the wire 12. However, FIG. 6 is nothing but the illustration for concretely explaining the contents of the present invention, and does not put any restrictions on the scope of the present invention. For instance, a plurality of the same detectors may be used to detect the density of the melt 6 at several points for enhancing the accuracy of the detection results. In order to detect the density of the melt 6 with high accuracy while suppressing thermal convection, the heater 4 may be divided to two parts as shown in FIG. 5 to control the temperature distribution of the melt 6 along a vertical direction.

When the reflection points $t_1$, $t_2$ of a raw material are already known, the melt may be prepared and conditioned as follows: The raw material is received in a crucible 2 shown in FIG. 7 and then melted to prepare a melt 6 while gauging the temperature of the melt 6 with thermometers 15$u$ and 15$d$. The temperature data of the melt 6 are outputted to a control unit 14. The control unit 14 calculates a quantity of heating power corresponding to the input data and supplies control signals to an upper heater 4$u$ and a lower heater 4$d$, respectively.

When any temperature of the melt 6 detected by each thermometer 15$u$ or 15$d$ is lower than the reflection point $t_1$, a seed crystal 7 is carried into contact with the surface of the melt 6 to start the pulling operation of a single crystal 8. The single crystal 8 obtained in this way is a high-quality product excellent in the consistency of crystal orientation without the inclusion of faults originated in clusters.

According to the present invention as aforementioned, the use of the density as a signal representing the minute structures of the melt or clusters enables to determine whether or not the melt is under the condition suitable for the pulling-up of a single crystal. Consequently, an excessively long holding time is unnecessitated, and the pulling-up of the single crystal is started in a short time after the preparation of the melt. Hereby, a period waiting for the initiation of the pulling-up is made shorter by such the manner wherein a raw material is melted by rapid heating, and a prepared melt is spontaneously cooled while detecting the density of the melt.

The pull method according to the present invention may be applicable for the growth of various single crystals from a mixed melt such as Si—Ge, a compound melt, e.g. GaAs, ZnSe, ZnTe, SiS or GeS, a metal melt, e.g. Fe, Ni or Cu, or an organic melt, e.g. anthracene as well as the Si or Ge melt.

In any case, there shall be presearched the reflection point $t_1$ in the temperature-density curve of each melt. The reflection point $t_1$ is used to determine the starting point of pulling-up operation, in such the manner that the temperature of a prepared melt is gauged during cooling and compared with the reflection point $t_1$.

Example 1

Growth Of Si Single Crystal

A polycrystalline Si raw material 40 kg was received in a crucible and completely melted by heating. The melt was then held at 1430 ° C. The density of the melt was continuously detected during the holding period. The density was changed with respect to the holding time as shown in FIG. 4. That is, the density of the melt rapidly increased in 2 hrs. just after the complete melting, reached the maximum value 2.593 g/cm$^3$ at 3 hrs. after and then gradually decreased.

The pulling-up operation was started at the time when the density showed the maximum value. A single crystal of 6 inches in diameter was obtained at a pulling speed of 1.0 mm/min. The single crystal was of high quality without the inclusion of dislocations as shown in Table 1. The dislocation-free rate in Table 1 was obtained by slicing the single crystal to flat discs, observing dislocations in the discs with X-ray topography and calculating the rate of parts where the dislocations were not observed.

For comparison, a single crystal was pulled up from the same melt just after being melted. Since the obtained single crystal included a lot of dislocations, it was formed to substrates suitable for semiconductor devices at a very low yield ratio.

TABLE 1

| DISLOCATION-FREE RATE OF Si SINGLE CRYSTAL | | |
| --- | --- | --- |
| | INITIATION OF PULLING-UP | DISLOCATION-FREE RATE |
| Ex. 1 | 3 HRS. AFTER MELTING | APPROXIMATELY 50% |
| Cf. 1 | IN 1 HRS. AFTER MELTING | APPROXIMATELY 30% |

It is noticed from Table 1 that the inclusion of minute faults and dislocations in the single crystal is suppressed by staring the pulling-up of the single crystal at the time when the density of the melt reaches tile maximum value. The larger dislocation-free rate suggests that the melt is under the stable condition wherein the melt or clusters do not change their minute structures, after the density of the melt reaches the maximum value. Hereby, a single crystal of high quality is obtained with high productivity.

Example 2

Growth Of Ge Single Crystal

A polycrystalline Ge raw material 1 kg was received in a crucible, completely melted by heating and then held at 990 ° C. The Ge melt changed its density as shown in FIG. 5 during the holding period. The density of the melt violently fluctuated for 2 hrs. after the complete melting, and then gradually decreased.

Pulling-up operation was started after the density came to approximately the constant value. AGe single crystal of 2 inches in diameter was grown from the melt at a pulling speed of 9 mm/hr. The obtained single crystal was of high quality, and the inclusion of dislocations was suppressed as shown in Table 2.

For comparison, pulling-up operation was started just after the raw material was melted. A single crystal obtained in this case included a lot of dislocations, so that the ratio of the single crystal to be used as substrates suitable for semiconductor devices was very small.

TABLE 2

DISLOCATION-FREE RATE OF Ge SINGLE CRYSTAL

| | INITIATION OF PULLING-UP | DISLOCATION-FREE RATE |
|---|---|---|
| Ex. 2 | 2 HRS. AFTER MELTING | APPROXIMATELY 60% |
| Cf. 2 | IN 1 HRS. AFTER MELTING | APPROXIMATELY 10% |

Example 3

Growth Of Ge Single Crystal

A Ge melt was prepared by completely melting a polycrystalline Ge raw material. The Ge melt showed different temperature-density curves with respect to a thermal hysteresis as shown in FIG. 3. After the raw material was melted, the melt was heated up to a certain temperature above 1100° C. to form a stable phase. The melt was then cooled near its melting point 920° C. When pulling-up operation was started using this heat-treated melt, the inclusion of minute faults and dislocations in the crystal was suppressed. Hereby, a single crystal of high quality was obtained with high productivity. The period from the melting of the raw material to the initiation of pulling-up was made 1 hr. or shorter by subjecting the melt to the cycle of heating and cooling.

Example 4

Growth Of Si Single Crystal

A melt prepared by melting a polycrystalline Si raw material changed its density as shown in FIG. 2 in relationship with its temperature. The changing rate of the density with respect to the temperature of the melt in zone ① from the melting point (≈1420° C.) to a temperature $t_1$ (≈1440° C.) was apparently different from that in zone ② above the temperature $t_1$. The difference suggests the formation of clusters having different minute structures in zone ②.

Figure 7:
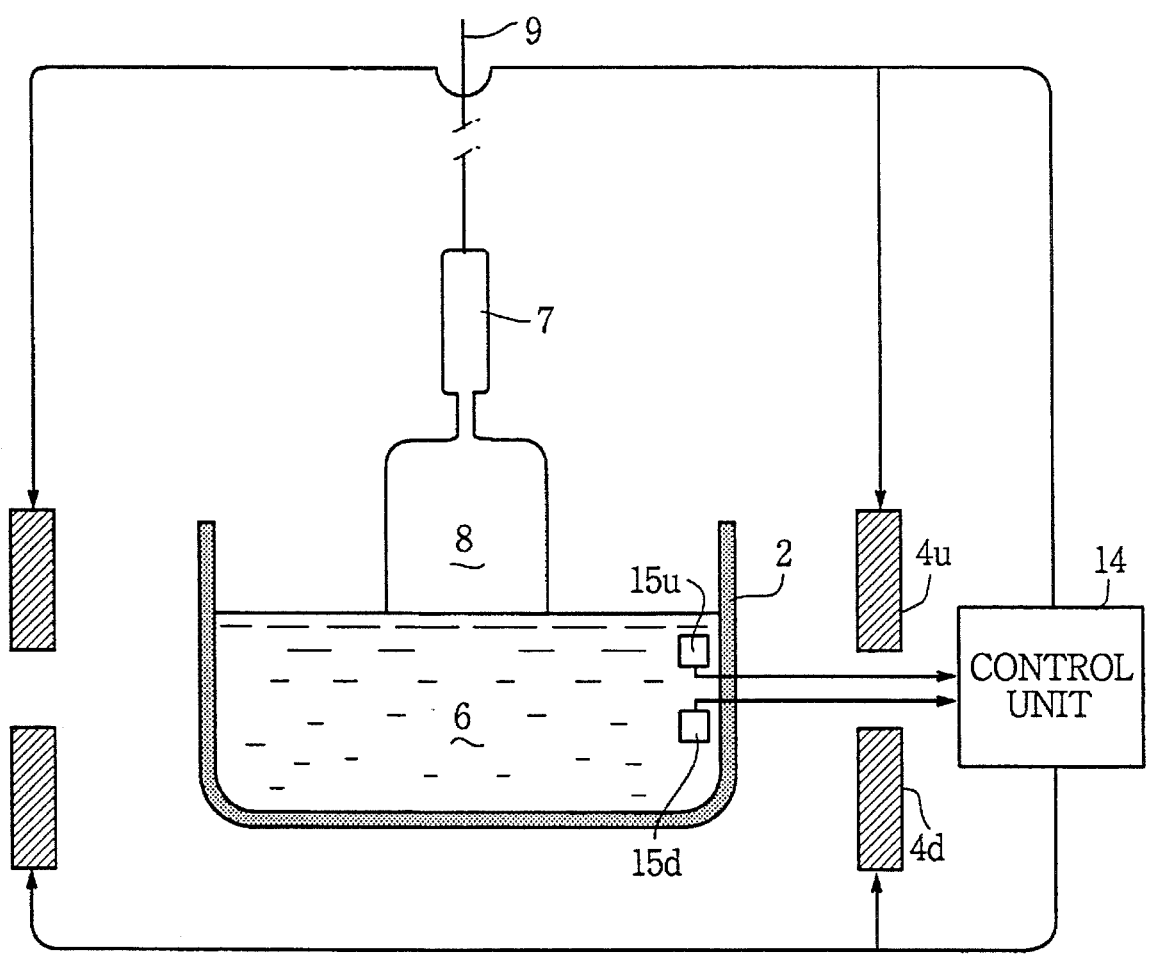
FIG. 7 is a schematic view illustrating another apparatus for pulling a single crystal from a melt.

The temperature of the melt 6 was detected using two thermometers 15u and 15d shown in FIG. 7. The pulling-up of a single crystal 8 was started, when both of the detected values were below the inflection point $t_1$. The melt 6 in this state had the temperature deviation, which was obtained by processing the detected values in the control unit 14, within a range of 15° C. or smaller.

The single crystal obtained in this way was of high quality, and the inclusion of faults such as dislocations was suppressed as shown in Table 3.

For comparison, a single crystal was pulled up from the melt 6 under the condition that its temperature was partially higher by 20° C. at most than the inflection point $t_1$. In this case, the temperature deviation was 60° C. at most.

TABLE 3

EFFECT OF TEMPERATURE DEVIATION ON DISLOCATION-FREE RATE

| | TEMPERATURE DEVIATION | DISLOCATION-FREE RATE |
|---|---|---|
| Ex. 4 | 15° C. | APPROXIMATELY 50% |
| Cf. 3 | 60° C. | APPROXIMATELY 30% |

According to the present invention as aforementioned, the stability of the melt is presumed on the basis of its density to determine an initiation time for pulling-up a single crystal from the melt. Since the change of the density accurately reflects the state of the melt, it is possible to start the pulling-up operation in a short time after the preparation of the melt. It does not take a long time to hold the melt until it comes to a homogenious state, so that a single crystal of high quality can be produced with high productivity. The obtained crystal does not include minute faults or dislocations originated in different liquid-phase minute structures suspended in the melt or clusters.

What is claimed is:

1. A method of pulling a single crystal from a melt comprising;
    detecting the density of a melt to determined the reflection point above which the density deviation of said melt becomes smaller, and
    starting operations for pulling up a single crystal from said melt at the time when said melt is subjected to a thermal hysteresis passing through said reflection point.

2. The method according to claim 1, wherein the density of the melt is detected using a detector hanging a bob to be dipped in said melt.

3. A method of pulling a single crystal from a melt comprising:
    dipping the bob of a density detector in a melt,
    weighing said density detector, to calculate the density of said melt,
    detecting the changing rate of the density with respect to the temperature of said melt, and
    starting an operation for pulling up a single crystal from said melt at the time when the changing rate change of said density with respect to the temperature becomes smaller.

4. A method of pulling a single crystal from a melt comprising:
    dipping the bob of a density detector in a melt,
    weighing said density detector, to calculate the density of said melt,
    detecting the changing rate of the density with respect to the temperature of said melt,
    holding the whole body of said melt at a temperature below the reflection point where the changing rate of said density changes from a larger value to a smaller value, and
    starting an operation for pulling up a single crystal from said melt.

5. An apparatus for pulling up a single crystal from a melt comprising;
    a crucible for receiving a melt provided in a closed chamber,
    a rotary winder for suspending a seed crystal,
    a density detector having a bob to be dipped in said melt, and a control unit to which a value detected by said density detector is inputted, whereby the initiation time of pulling-up operation is calculated on the basis of the input data in the control unit, and outputted to said rotary winder.

* * * * *